(12) United States Patent
He (10) Patent No.: US 7,198,965 B2
(45) Date of Patent: Apr. 3, 2007

(54) METHOD FOR MAKING A NEO-LAYER COMPRISING EMBEDDED DISCRETE COMPONENTS

(75) Inventor: Sambo He, Corona, CA (US)

(73) Assignee: Irvine Sensors Corp., Costa Mesa, CA (US)

( * ) Notice: Subject to any disclaimer, the term of this patent is extended or adjusted under 35 U.S.C. 154(b) by 0 days.

(21) Appl. No.: 11/354,370

(22) Filed: Feb. 14, 2006

(65) Prior Publication Data

US 2006/0134835 A1    Jun. 22, 2006

Related U.S. Application Data

(63) Continuation-in-part of application No. 10/703,177, filed on Nov. 6, 2003, now abandoned.

(51) Int. Cl.
*H01L 21/66* (2006.01)

(52) U.S. Cl. ............................ 438/15; 438/14; 438/17; 257/E21.521

(58) Field of Classification Search ................ 438/14, 438/15, 16, 17, 18, 107, 108, 110, 112, 124, 438/126, 127
See application file for complete search history.

(56) References Cited

U.S. PATENT DOCUMENTS

| 6,136,212 | A  | * | 10/2000 | Mastrangelo et al. | ......... 216/49  |
| 6,379,988 | B1 | * | 4/2002  | Peterson et al.    | ............ 438/115 |
| 6,557,978 | B2 | * | 5/2003  | Silverbrook        | ................. 347/54 |
| 6,952,108 | B2 | * | 10/2005 | Blalock            | ....................... 438/17 |

* cited by examiner

*Primary Examiner*—Kevin M. Picardat
(74) *Attorney, Agent, or Firm*—W. Eric Boyd, Esq.

(57) ABSTRACT

A stackable neo-layer comprising one or more embedded discrete electrical components is provided. A plurality of conductive traces, some of which terminate at a peripheral edge of the layer, are formed on sacrificial substrate in a series of process steps and discrete electrical components such as thick film components or wire bonded components are attached thereto. An under-bump metal process step is disclosed and provides for solder attachment at desired contact pad locations. The layer is encapsulated in a potting material and thinned to provide a thin, stackable layer. When assembled into a stack of layers, the electrically conductive traces terminating at the edge of the layer can be electrically connected by means of electroplating using a T-connect.

16 Claims, 7 Drawing Sheets

METHOD FOR MAKING A NEO-LAYER COMPRISING EMBEDDED DISCRETE COMPONENTS

CROSS REFERENCE TO RELATED APPLICATIONS

This application is a continuation-in-part of U.S. patent application Ser. No. 10/703,177, filed Nov. 6, 2003, now abondoned, entitled "Neo-Wafer Device and Method" and is fully incorporated herein by reference.

STATEMENT REGARDING FEDERALLY SPONSORED RESEARCH AND DEVELOPMENT

Not applicable

BACKGROUND OF THE INVENTION

1. Background of the Invention

The invention relates generally to stacked microelectronic modules. Specifically, the invention relates to a method for making a device comprised of stacked integrated circuit (IC) package layers comprising embedded discrete electrical components (e.g., thin or thick film, surface mounted resistors, capacitors and the like, or wire-bonded active or passive components), that are connected to an external circuit.

The ability to form very thin, stackable layers, each containing one or a plurality of homogeneous or heterogeneous integrated circuit chips is desirable and allows high density, high speed systems to be assembled for use in military, space, security and other applications.

Examples of such layers and modules, referred to as "neo-layers" or "neo-stacks" are disclosed in U.S. Pat. No. 6,797,537, Method of Making Stackable Layers Containing Encapsulated Integrated Circuit Chips With One or More Overlying Interconnect Layers, U.S. Pat. No. 6,784,547, Stackable Layers Containing Encapsulated Integrated Circuit Chips With One or More Overlying Interconnect Layers, U.S. Pat. No. 6,117,704, Stackable Layer Containing Encapsulated Chips, U.S. Pat. No. 6,072,234, Stack of Equal Layer Neo-Chips Containing Encapsulated IC Chips of Different Sizes and U.S. Pat. No. 5,953,588, Stackable Layers Containing Encapsulated IC Chips, all of which are incorporated fully herein by reference and all of which are assigned to Irvine Sensors Corp., the assignee herein.

2. Brief Summary of the Invention

The present invention discloses a device and method comprising one or more neolayers each containing at least one embedded discreet component such as a thin or thick film surface mount technology (SMT) component or wire bonded component.

A process for forming a neo-layer comprising one or more SMT or wire-bonded discrete components is generally as follows. A first dielectric layer is provided upon a sacrificial substrate. A field metallization layer is then provided upon the first dielectric layer. A first photoresist image is provided upon the field metal to define conductive traces for subsequent electroplating/buildup. The conductive trace pattern preferably includes one or more of the traces terminating at or near the peripheral edge of the layer to be stacked. The cross-section of the trace terminating at the peripheral edge will be exposed to define a conductive edge contact point whereby, when the layer is stacked with other layers, the edge contact point can be connected to another point by means of a conductive T-connect structure.

The first photoresist image is removed after electroplating, the field metal etched, resulting in an electrically conductive set of electroplate traces. The electroplate traces are coated with a second dielectric layer and a second photoresist image defined to delineate predefined via patterns in the layer. Vias are etched into the second dielectric layer to expose desired portions of the electroplate traces to form contact pads. Remaining portions of the second photoresist image are then removed.

A third photoresist image is provided to isolate or expose preselected contact pads, the exposed of which will be provided with an under-bump metal to facilitate later SMT component solder attachment. An under-bump metal is applied to the exposed contact pads at this process step to define an under-bump pad.

The third photoresist image is removed, exposing a second set of contact pads for use a wire bond pads.

SMT discrete components are soldered to the under-bump contact pads at desired locations. Wire bonded components are connected at desired wire bond pads, each of said component types disposed upon an insulating dielectric structure formed by the above photoresist/dielectric process steps.

The entire surface comprising the electroplate traces and components is encapsulated in a non-conductive potting material and the substrate removed to define an upper structure surface and a lower structure surface Predetermined portions of the first and second surface of the structure are removed to a provide a final thickness. A fourth photoresist image is provided on the lower structure surface to define one or more vias through the first dielectric layer for testing of the layer and its components.

The fourth photoresist image is removed, the layer diced to final size resulting in a very thin, high density layer comprising one or more embedded discrete components.

In the above manner, neo-layers containing embedded discrete electronic devices can be efficiently manufactured, stacked and interconnected in a reliable, low cost microelectronic module.

While the claimed embedded discrete device layer apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112, are to be accorded full statutory equivalents under 35 USC 112.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENT

Figure 1A:
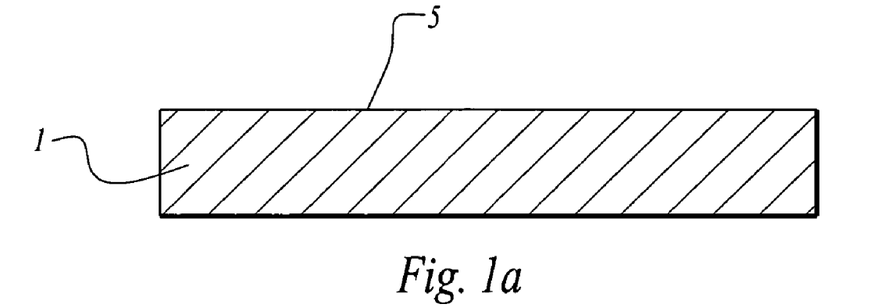
FIGS. 1a through 1d illustrate the initial process steps of the stackable layer of the invention whereby a first photoresist image is made.
Figure 1B:
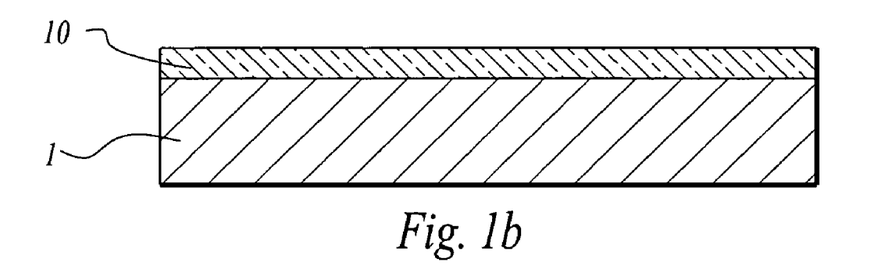
Figure 1C:
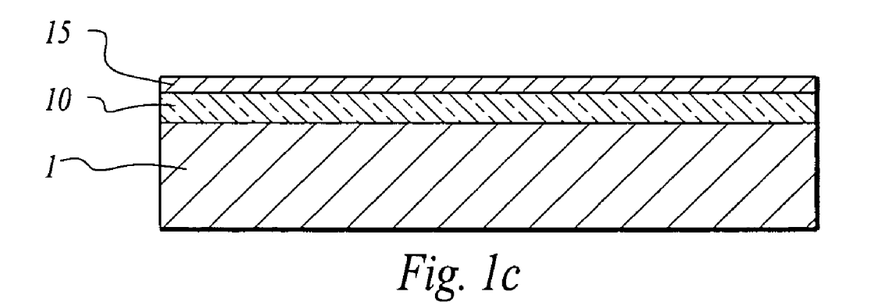
Figure 1D:
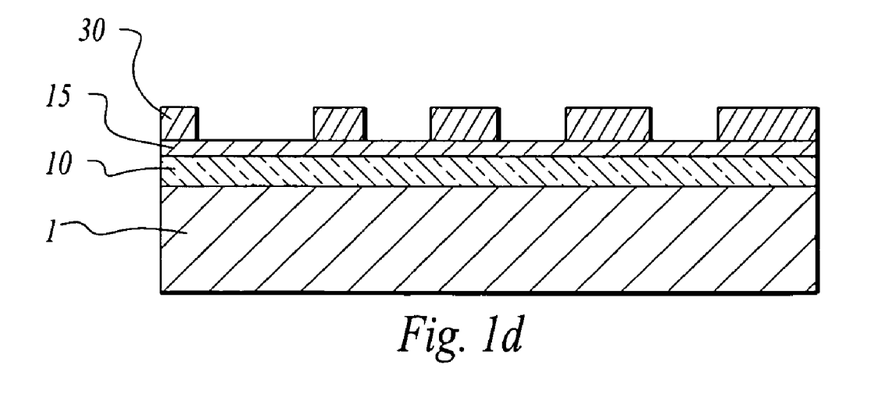

Turning now to the figures wherein like numerals identify like elements among the several views, FIGS. 1a through 1c show a sacrificial substrate, such as an aluminum substrate 1 having a first surface 5 with a first dielectric layer 10 disposed thereon and a field metal 15 disposed upon first dielectric layer 10. In a preferred embodiment a 0.032" thick aluminum wafer has first dielectric layer 10, such as a polyimide, formed with a thickness of about four microns. A thin field metal layer 15 such as titanium/tungsten/gold is formed on the first dielectric layer 10 as a base for subsequent build up of selected portions as electrically conductive traces as is discussed below.

FIGS. 1d, 2a–2c show preferred embodiment of related process steps for the definition of a plurality of electrically conductive traces on first dielectric layer 10. A first photoresist pattern 30 that provides a photolithographic pattern for the conductive traces to be formed, is provided on field metal 15. First photoresist pattern 30 is exposed, developed using standard photolithographic processes to provide the appropriate pattern for the conductors to be formed. The exposed field metal electroplated with gold to build up the cross section of the conductive traces. In a preferred embodiment, one or more of the conductive traces terminate at or near the edge of each of the layers to be stacked. In this manner, the cross-section of the traces can be exposed at the edges of the stacked layers in a stack of layers and interconnected by means of an electrically conductive pattern forming a T-connect structure or other suitable means as taught in the above cited patents.

Figure 2A:
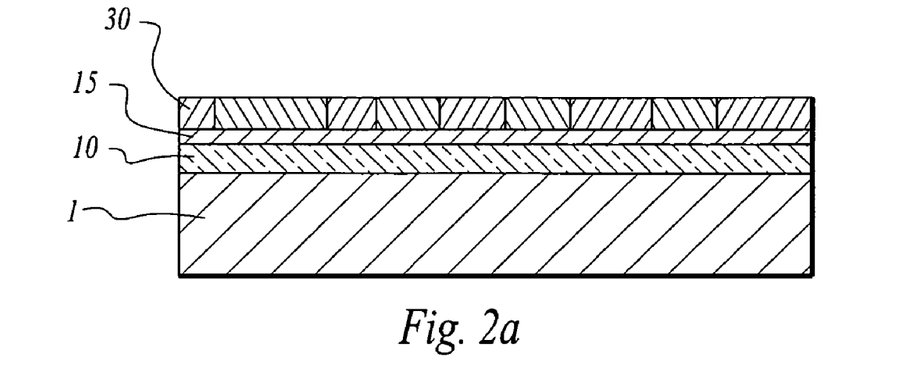
FIGS. 2a through 2d show further process steps whereby a plurality of conductive traces are formed.
Figure 2B:
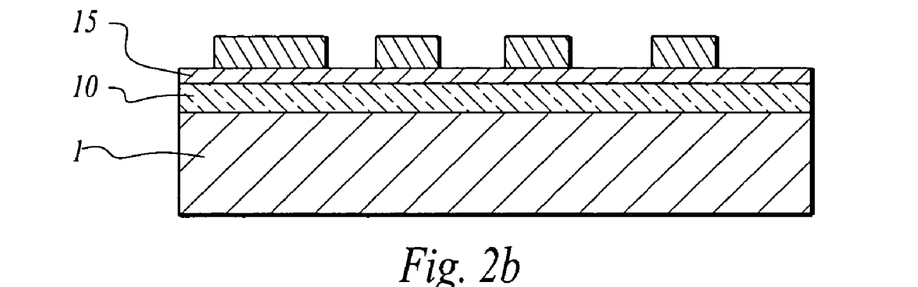
Figure 2C:
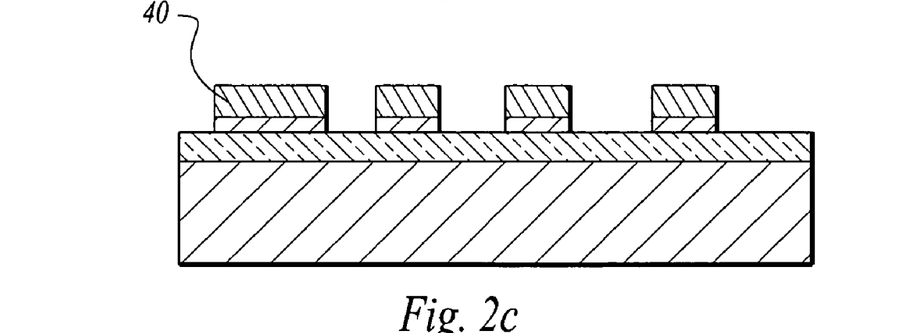

First photoresist layer pattern 30 is removed, leaving the desired built-up electrically conductive traces 40. Remaining exposed field metal is etched such that the desired electrically conductive traces 40 remain as seen in FIG. 2c.

Figure 2D:
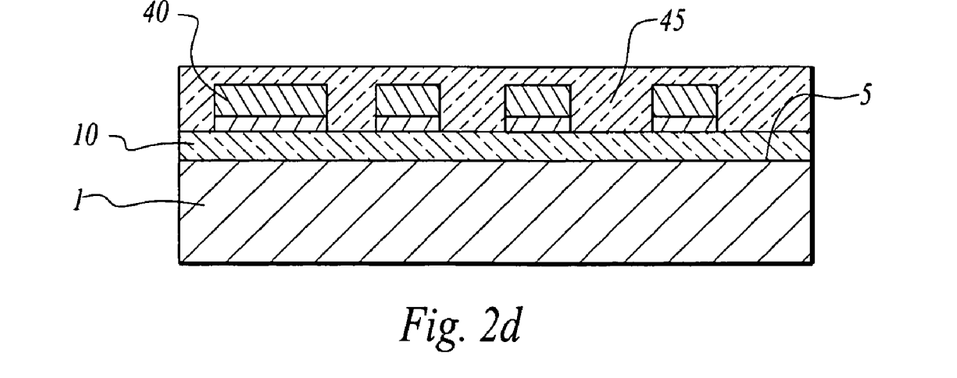

Referring to FIG. 2d, first surface 5 and electrically conductive traces 40 thereon are encapsulated in a second dielectric layer 45, such as a polyimide.

Figure 3A:
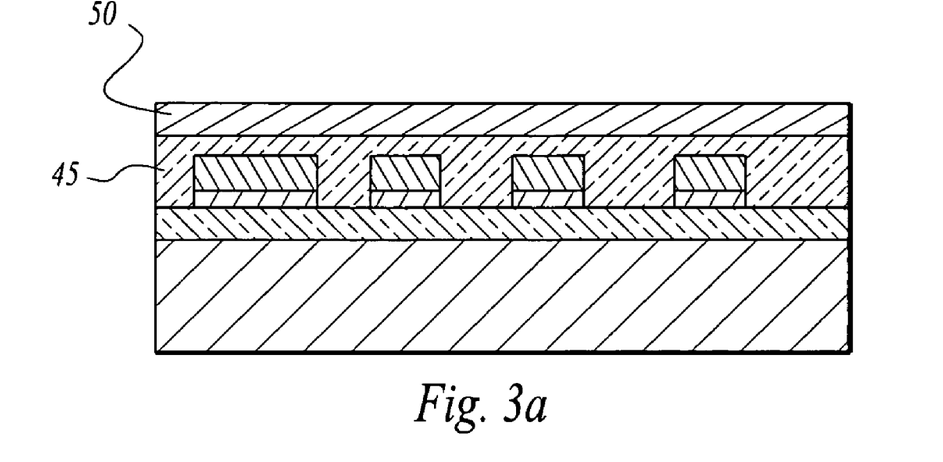
FIGS. 3a through 3c disclose further process steps to expose portions of the conductive traces to define vias and conductive pads.
Figure 3B:
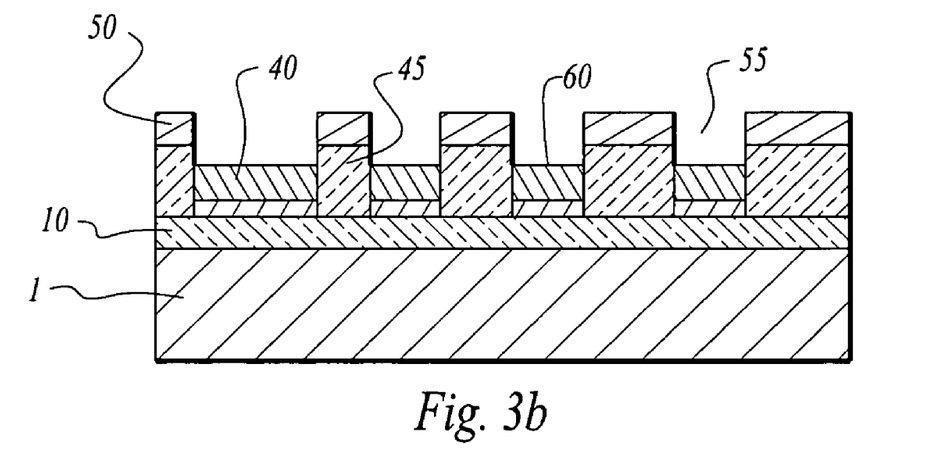
Figure 3C:
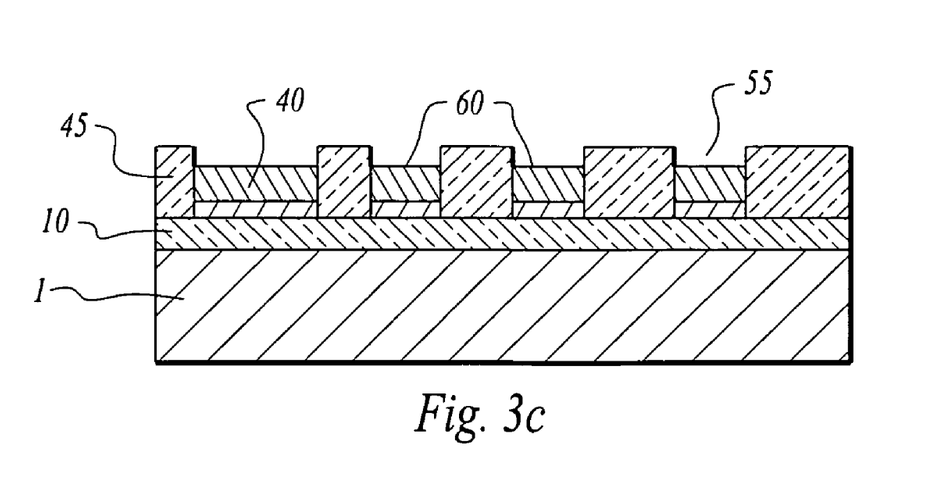

Turning to FIGS. 3a–3c, a second photoresist pattern 50 is provided upon the surface of second dielectric layer 45. Second photoresist pattern 50 is developed and the exposed portions of second dielectric layer 45 are removed as by etching. The etching provides for the removing of predetermined portions of second photoresist pattern 50 to define one or more vias 55 with one or more contact pads 60 disposed therein.

Figure 4A:
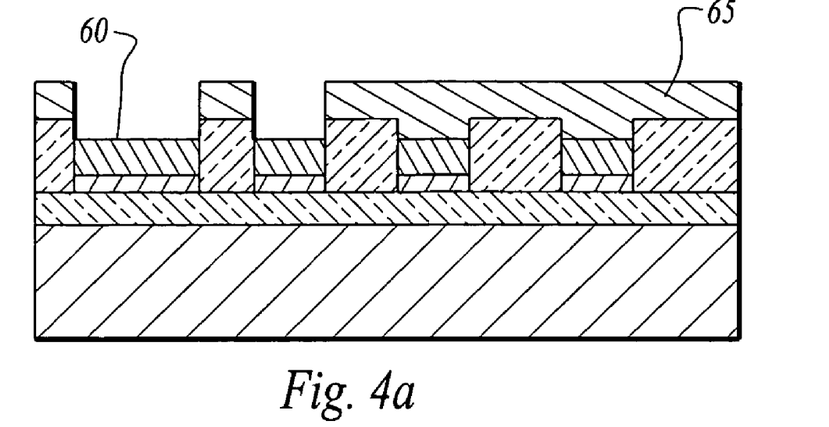
FIGS. 4a through 4c show the selective applications of a photoresist pattern to isolate predetermined conductive pads for under bump metal.
Figure 4B:
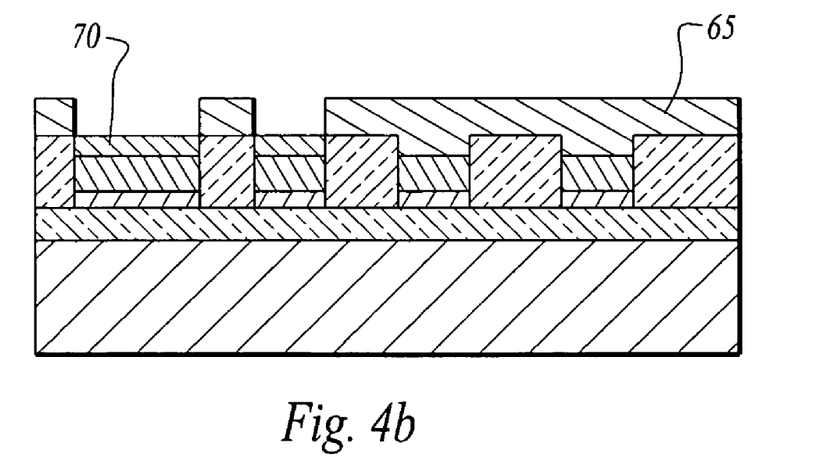
Figure 4C:
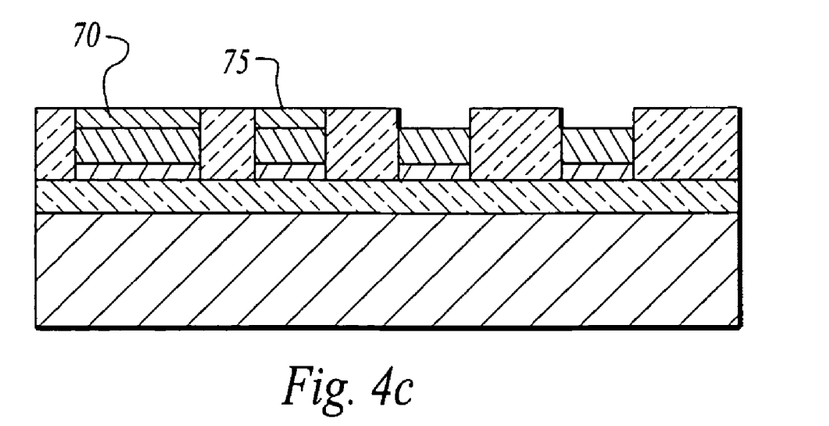

As more clearly seen in FIGS. 4a–c, in an alternative preferred embodiment, a third photoresist image 65 is provided for the selective isolation and exposure of predetermined contact pads for the application of an under-bump metal 70 for the soldering of one or more discrete components to the under-bumped contact pad 75 as seen in FIGS. 4a–4c. A preferred under-bump metal is nickel-gold. After application of under-bump metal 70 upon the predetermined contact pads, third photoresist pattern 65 is removed using processes well known in the photolithography and plating arts.

In this embodiment, a stackable layer is provided comprising one or more sets of contacts pads, selected ones comprising an under-bump metal for soldering of discrete components and selected other ones comprising contact pads for wirebonding of discrete electrical components. Conductive epoxies and other suitable means of electrically connecting a discrete component to any form of conductive pad of the invention are within the scope of the claims.

Figure 5A:
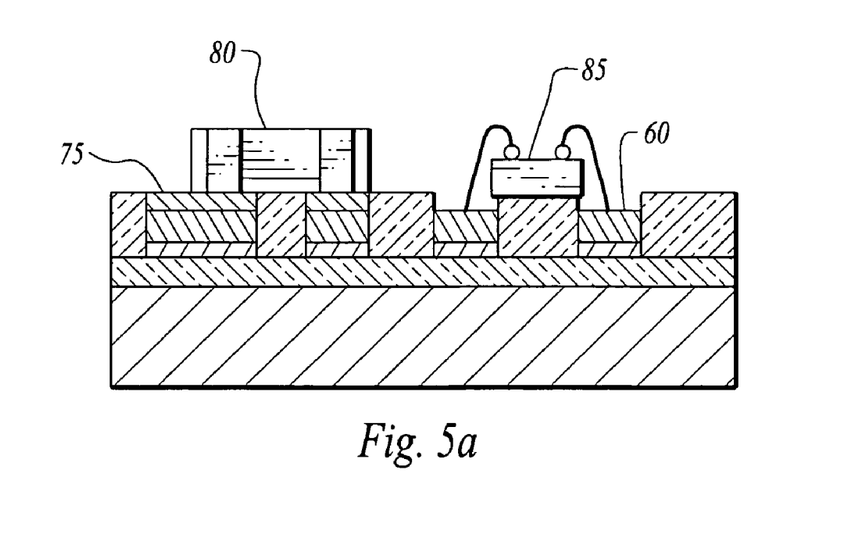
FIGS. 5a through 5c illustrate the incorporation of discrete elements and encapsulating of the disclosed invention.

FIG. 5a illustrates the next process step of the connection of a soldered component 80 and a wire bonded component 85 to the respective under-bumped contact pad 75 and contact pad 60.

Figure 5B:
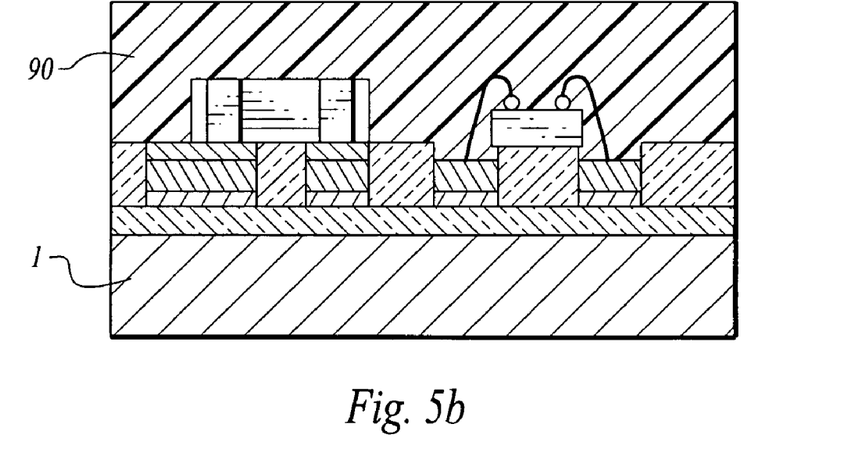
Figure 5C:
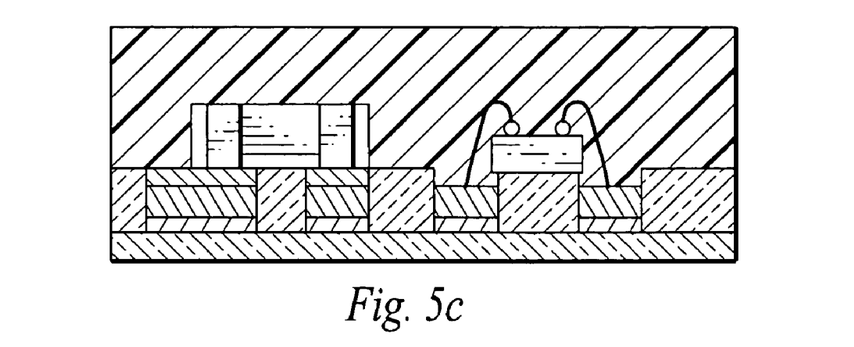

First surface is then encapsulated in a non-conductive potting material 90 such as EpoxySet 3030 available from Epoxy Set, Inc. and sacrificial substrate 5 removed to as seen in FIGS. 5b and 5c. Any suitable means may be used to remove sacrificial substrate 5 such as grinding, lapping, chemical-mechanical polishing (CMP) or etching.

In this manner, a component surface 95 and a test surface 100 are defined.

Figure 6A:
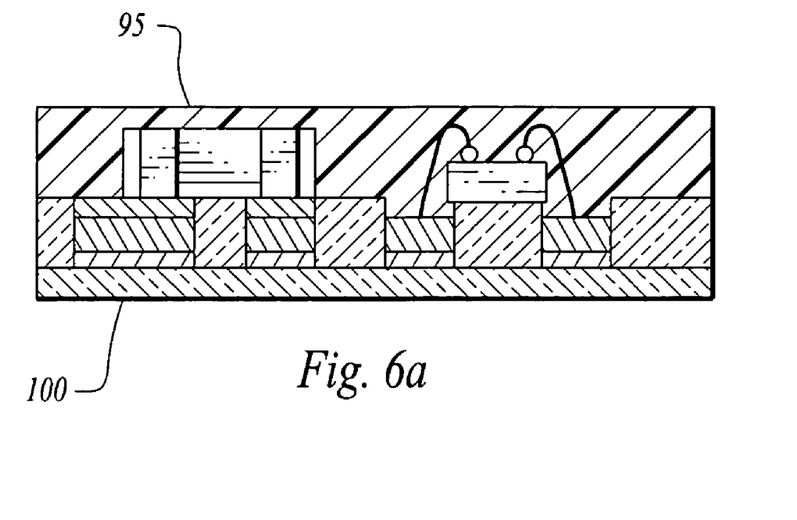
FIGS. 6a through 6c disclose the final grinding and creation of test vias in a layer of the disclosed invention.

Referring to FIG. 6a, a predetermined portion of stackable layer is removed, such as by grinding or lapping of a portion of potting material 90.

Figure 6B:
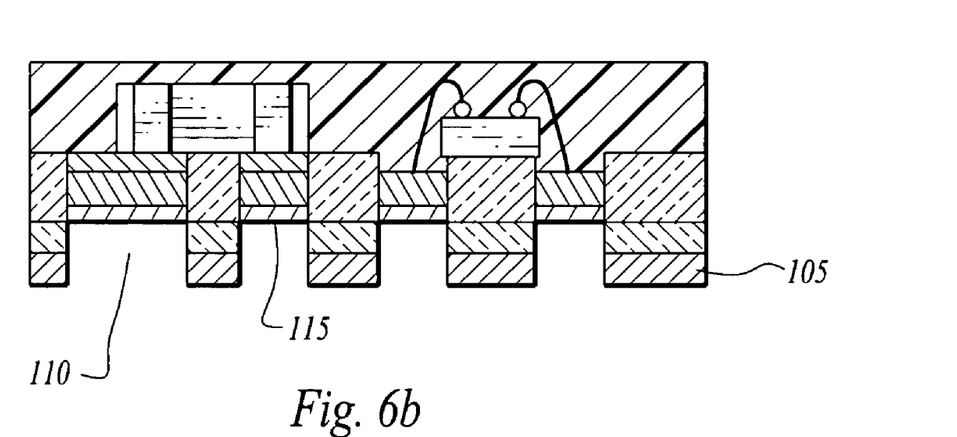
Figure 6C:
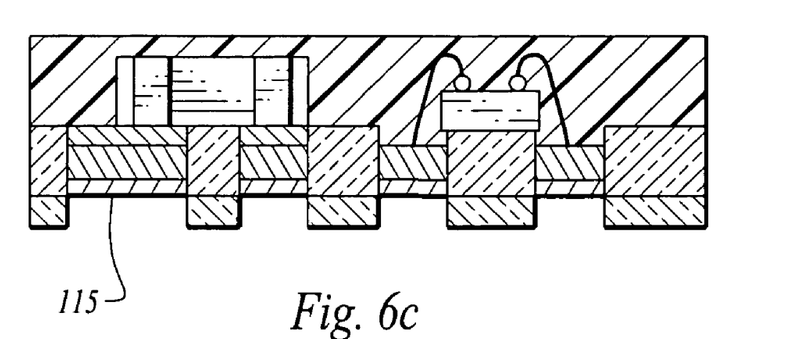

In the preferred embodiment, a fourth photoresist image 105 is defined upon test surface 100. Fourth photoresist image 105 is developed and test vias 110 defined to expose preselected portions of conductive traces 40 in first dielectric layer to create test contact pads 115. Test contact pads 115 provide electrical access to the now-encapsulated circuit and are used to ensure continuity, device functionality and performance in each layer prior to stacking the layers in a module.

The stackable layer is singulated by means such as a dicing saw whereby preselected ones of conductive traces terminate at or near the peripheral edge of the layer. When stacked, the cross-section of terminal ends of the conductive traces may be exposed to create edge contact points 120 on one or more of the sides of the stack. Preselected exposed edge contact points 120 can then be routed and interconnected, such as by forming T-connect structures using plated-on metal conductive patterns as disclosed in the cited patents.

Figure 7A:
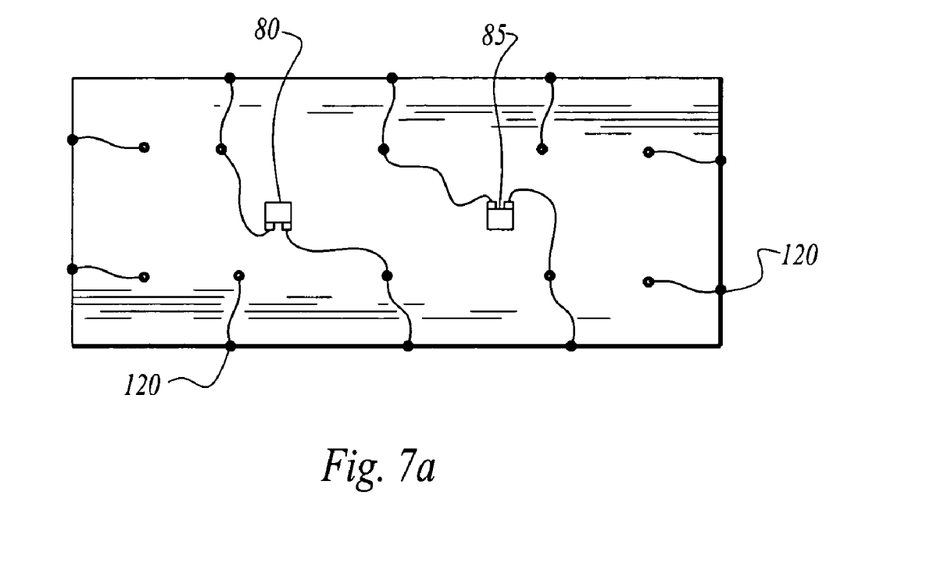
FIGS. 7a and 7b reflect an exemplar plan view of a stackable layer of the invention and a side view of a stack of layers showing exposed conductive traces for interconnection between layers.
Figure 7B:
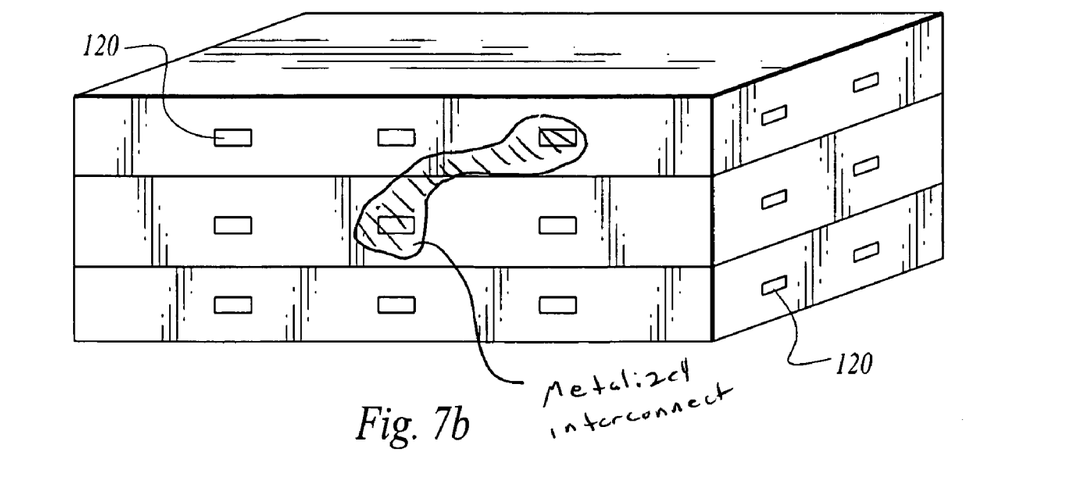

An exemplar layer showing edge contact points 120 terminating at the edge of a layer and a side view of a plurality of edge contact points 120 terminating on the side of a stack of layers for subsequent interconnection is shown in FIGS. 7a and 7b.

In the above manner, a stackable layer incorporating one or more discrete electrical components is provided that is high density, and can be tested after layer manufacturing but prior to stacking in a three dimensional module. The layers can be stacked and predetermined edge contact points interconnected as disclosed in the above cited patents.

Therefore, it must be understood that the illustrated embodiment has been set forth only for the purpose of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed even when not initially claimed in such combinations.

The words used in this specification to describe the invention and its various embodiments are to be understood not only in the sense of their commonly defined meanings, but to include by special definition in this specification, structure, material or acts beyond the scope of the commonly defined meanings. Thus, if an element can be understood in the context of this specification as including more than one meaning, then its use in a claim must be understood as being generic to all possible meanings supported by the specification and by the word itself.

The definitions of the words or elements of the following claims are therefore defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim.

Although elements may be described above as acting in certain combinations and even initially claimed as such, it is to be expressly understood that one or more elements from a claimed combination can, in some cases be excised from the combination and that the claimed combination may be directed to a sub-combination or variation of a sub combination.

Insubstantial changes from the claimed subject matter as viewed by a person with ordinary skill in the art, now known or later devised, are expressly contemplated as being equivalent within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the fundamental idea of the invention.

I claim:

1. A method for making a stackable layer comprising the steps of:
   providing a sacrificial substrate having a first surface and a second surface,
   defining a first dielectric layer on said first surface,
   defining a plurality of electrically conductive traces on said first dielectric layer,
   defining a second dielectric layer upon said first dielectric layer whereby said electrically conductive traces are encapsulated therein,
   removing predetermined portions of said second dielectric layer to expose portions of said electrically conductive traces to define a plurality of contact pads,
   electrically connecting at least one discrete electrical component to at least one of said contact pads,
   encapsulating said second dielectric layer and said at least one discrete electrical component in a potting material,
   removing said sacrificial layer to define a component surface and a test surface, and,
   defining one or more vias in said test surface to define a test contact pad.

2. The method of claim 1 where said substrate is an aluminum material.

3. The method of claim 1 where said substrate is removed by etching.

4. The method of claim 1 where said dielectric is a polyimide material.

5. The method of claim 1 further comprising the step of testing said stackable layer.

6. The method of claim 1 wherein said at least one discrete electrical component is electrically connected by means of a wire bond.

7. The method of claim 1 further comprised of removing a predetermined portion said potting material.

8. A method for making a stackable layer comprising the steps of:
   providing a sacrificial substrate having a first surface and a second surface,
   defining a first dielectric layer on said first surface,
   defining a plurality of electrically conductive traces on said first dielectric layer,
   defining a second dielectric layer upon said first dielectric layer whereby said traces are encapsulated therein,
   removing predetermined portions of said second dielectric layer to define a plurality of contact pads,
   providing an under-bump metal on at least one of said contact pads to define an under-bump metal contact pad
   electrically connecting at least one discrete electrical component to at least one of said under-bump metal contact pads by means of a solder connection,
   encapsulating said at least one discrete electrical component in a potting material,
   removing said sacrificial layer to define a component surface and a test surface, and,
   defining one or more vias in said test surface to define a test contact pad.

9. The method of claim 8 wherein said at least one discrete electrical component is a thick film surface mount component.

10. The method of claim 8 wherein said at least one discrete electrical component is a thin film surface mount component.

11. The method of claim 8 where said substrate is an aluminum material.

12. The method of claim 8 where said substrate is removed by etching.

13. The method of claim 8 where said dielectric is a polyimide material.

14. The method of claim 8 further comprising the step of testing said stackable layer.

15. The method of claim 8 wherein said at least one discrete electrical component is electrically connected by means of a wire bond.

16. The method of claim 8 further comprised of removing a predetermined portion said potting material.

* * * * *

UNITED STATES PATENT AND TRADEMARK OFFICE
CERTIFICATE OF CORRECTION

PATENT NO. : 7,198,965 B2  Page 1 of 1
APPLICATION NO. : 11/354370
DATED : April 3, 2007
INVENTOR(S) : Sambo He It is certified that error appears in the above-identified patent and that said Letters Patent is hereby corrected as shown below:

ON THE TITLE PAGE:  The following priority information is added:

(60)   Provisional application No. 60/424,022, filed on November 6, 2002.

IN THE SPECIFICATION:

Column 1, Line 11: "fully incorporated herein by reference", should read --fully incorporated herein by reference, and which claims the benefit of U.S. Provisional application No. 60/424,022, filed on Nov. 6, 2002--.

Signed and Sealed this

Nineteenth Day of May, 2009

JOHN DOLL
*Acting Director of the United States Patent and Trademark Office*